(12) United States Patent  
Yin

(10) Patent No.: US 7,511,582 B2
(45) Date of Patent: Mar. 31, 2009

(54) VOLTAGE CONTROLLED OSCILLATOR FOR USE IN PHASE LOCKED LOOP

(75) Inventor: Guangming Yin, Foothill Ranch, CA (US)

(73) Assignee: Broadcom Corporation, Irvine, CA (US)

( * ) Notice: Subject to any disclaimer, the term of this patent is extended or adjusted under 35 U.S.C. 154(b) by 817 days.

(21) Appl. No.: 10/623,992

(22) Filed: Jul. 21, 2003

(65) Prior Publication Data

US 2004/0027207 A1 Feb. 12, 2004

Related U.S. Application Data

(60) Provisional application No. 60/403,457, filed on Aug. 12, 2002.

(51) Int. Cl.
*H03L 7/00* (2006.01)

(52) U.S. Cl. .................. 331/36 C; 331/34; 331/16; 331/177 V; 331/179; 331/177 R; 360/51; 710/1; 375/376; 341/63

(58) Field of Classification Search .............. 331/36 C, 331/34, 16, 177 V, 179, 177 R; 360/51; 710/1; 375/376; 341/63; 340/536

See application file for complete search history.

(56) References Cited

U.S. PATENT DOCUMENTS 6,342,818 B1 * 1/2002 Segawa et al. .............. 331/14
6,362,698 B1 * 3/2002 Gupta .................. 331/117 FE

* cited by examiner

*Primary Examiner*—Michael B Shingleton
(74) *Attorney, Agent, or Firm*—Garlick Harrison & Markison; Bruce E. Garlick

(57) ABSTRACT

The present invention provides a clock circuit to produce a Reference Clock Signal used to latch data between first bit stream(s) and second bit stream(s), wherein the number and bit rate of the first bit stream(s) and the second bit stream(s) differ. The VCO generates one of a number of inputs to a PLL within the clock circuit. At a minimum, these inputs include a first bit stream data clock. Additionally, these inputs may further include a Loop Timing Clock Signal, an External Reference Clock Signal, and/or a Reverse Clock Signal for the PLL. The input provided by the VCO make up a VCO Output Signal wherein a filtering circuit that circuit includes a capacitor and a resistor reduces noise contained within the VCO Output Signal.

21 Claims, 18 Drawing Sheets

Receiver Input and Source Centered Clock Performance

| Parameter | Symbol | Conditions | Min | Typ | Max | Units |
|---|---|---|---|---|---|---|
| Output Common Mode | Vcm | See Figure Below | 1575 | 1675 | 1775 | mV |
| Single Ended Output Impedance | $Z_{SE}$ | | 40 | 50 | 60 | Ω |
| Differential Input impedance | $Z_d$ | | 80 | 100 | 120 | Ω |
| Input Impedance Mismatch | $Z_M$ | | | | 10 | % |
| Q40, CML Input Differential Amplitude, p-p | Δ VQDO | See Figure Below | 400 | 500 | 600 | mV |
| Q40 Input Rise and Fall Time (20% to 80%) | $t_{RH}$, $t_{FH}$ | | | 25 | 35 | ps |
| Differential output return loss* | S11 | Up to 7.5 GHz | 10 | | | dB |
| 4-by-1 mux input return loss >15 db at 10 GHz ||||||||

500

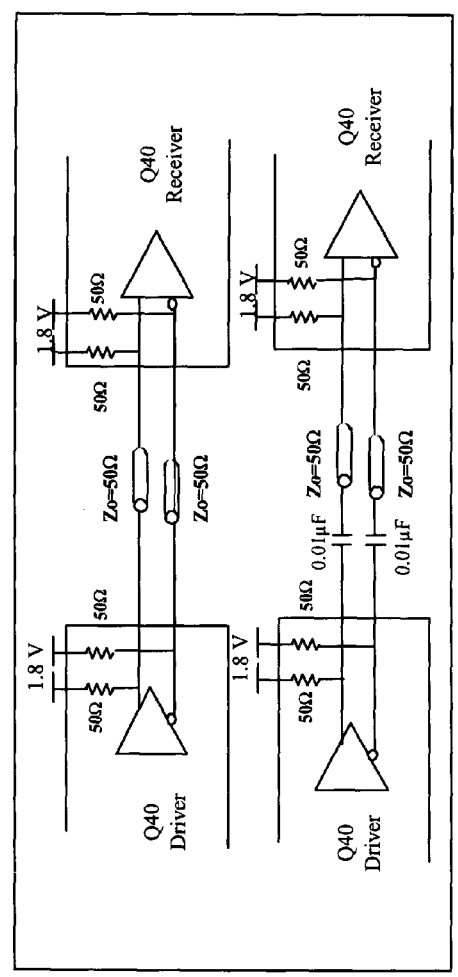

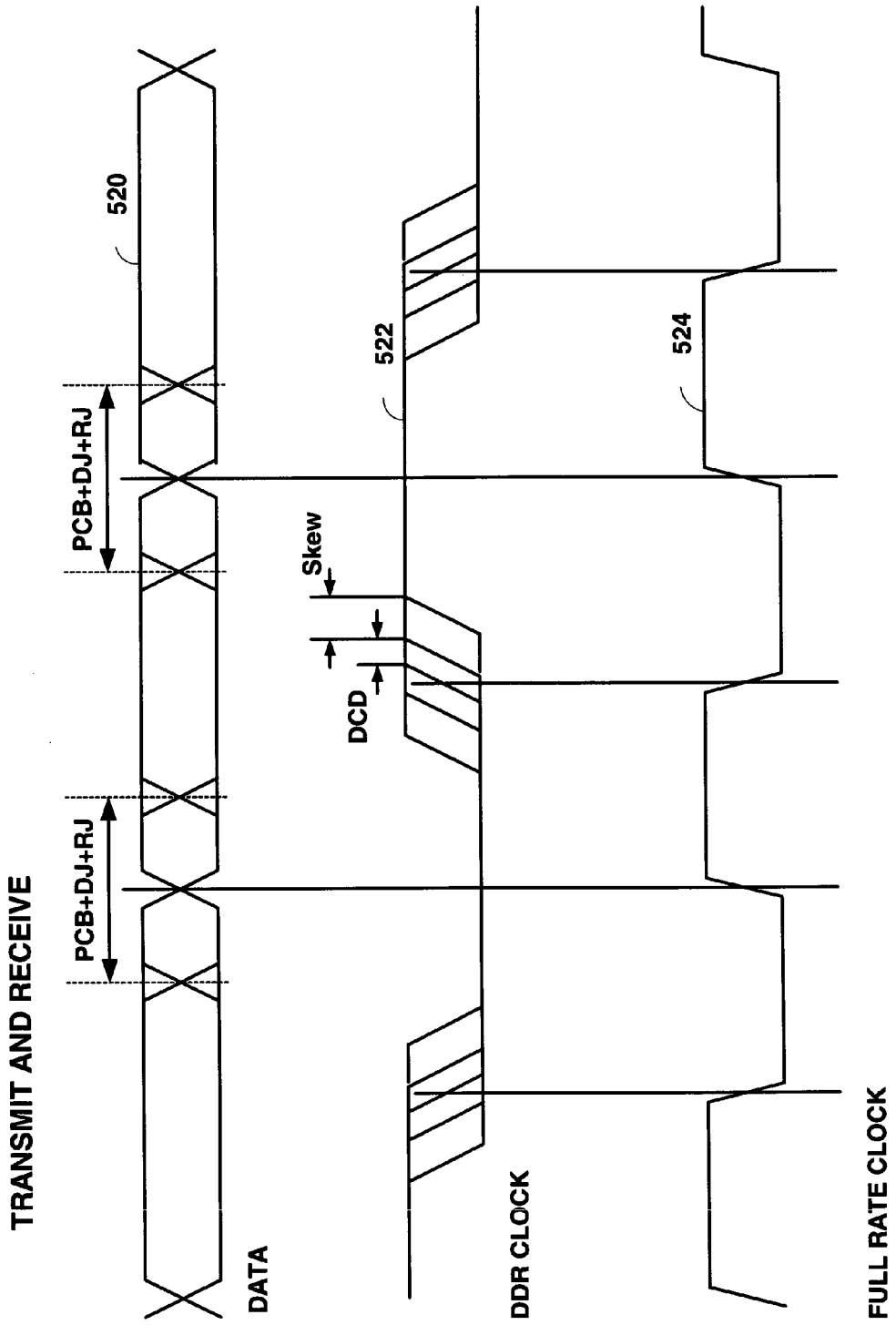

VOLTAGE CONTROLLED OSCILLATOR FOR USE IN PHASE LOCKED LOOP

RELATED APPLICATIONS

This application claims priority to U.S. Provisional Application Ser. No. 60/403,457, filed Aug. 12, 2002, which is incorporated herein by reference in its entirety for all purposes.

TECHNICAL FIELD OF THE INVENTION

The present invention relates generally to communication systems; and more particularly to high-speed serial bit stream communications.

DESCRIPTION OF RELATED ART

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure.

The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) are mounted upon the PCBs of the housing. These ASICs perform switching operations for the data that is received on the coupled media and transmitted on the coupled media. The coupled media typically terminates in a receptacle and transceiving circuitry coupled thereto performs signal conversion operations. In most installations, the media, e.g. optical media, operates in a simplex fashion. In such case, one optical media carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Particular difficulties arise in converting data between the 40×1 GBPS line interface and the 16×2.5 GBPS communication ASIC interface. In particular, operation on the 40 GBPS side is particularly susceptible to noise and requires the ability to switch data at a very high bit rate, e.g., exceeding the bit rate possible with a CMOS integrated circuit formed of Silicon. While other materials, e.g., Indium-Phosphate and Silicon-Germanium provide higher switching rates than do Silicon based devices, they are very expensive and difficult to manufacture. Further, the functional requirements of interfacing the 40×1 GBPS line interface and the 16×2.5 GBPS communication ASIC interface are substantial. Thus, if a device were manufactured that could perform such interfacing operations; the effective yield in an Indium-Phosphate or Silicon-Germanium process would be very low.

Noise associated with data and clock signals in high-speed data communications systems running at clock and data rates in excess of 10 GBPS can be very difficult to avoid and can adversely impact the integrity of data. This noise can affect both the clock signals in amplitude and frequency. Additionally, clock signals operating with high bit rate applications must be stable enough to withstand the jitter associated with the incoming signals. Such clock signals are often used to latch data between multiplexers and demultiplexers.

A PLL, which typically includes a phase detector, loop filter, and Voltage Controlled Oscillator (VCO) may generate the clock signals. The VCO, in this circuit, must produce a stable clock with minimal noise at these clock frequencies. Prior VCOs were not able to function in this manner. Further, instabilities or noise in the voltages supplied to the VCO can adversely affect the stability of the generated clock. The noise can cause the voltage supplied to the VCO to change, thus affecting the frequency of the VCO. Some prior art solutions involved filtering signals with separate integrated circuits. Thus a need exists for a method to produce stable high bit rate clocks and reduce noise associated with high-speed data and clock signals without routing the signals to other external circuits that create additional delay problems, consume power and increase the overall complexity of these circuits.

BRIEF SUMMARY OF THE INVENTION

The present invention provides a high-speed data conversion circuit. More specifically, a high speed bit stream data conversion circuit that includes a first data conversion circuit that receives a first bit stream(s) at a first bit rate and a corresponding first bit stream data clock. The first data conversion circuit then produces a second bit stream(s) having a second bit rate, wherein the number and bit rate of the first bit stream(s) and the second bit stream(s) differ.

A clock circuit produces a Reference Clock Signal based on a number of inputs that include the first bit stream data clock, wherein the Reference Clock Signal latches data from the first bit stream(s). The inputs to the clock circuit may further include a Loop Timing Clock Signal; an External Reference Clock Signal; a Reverse Clock Signal provided by an external data conversion circuit; or other like signals. This clock circuit includes a phase locked loop (PLL) with a phase detector that receives the first bit stream data clock and a loop output. The clock circuit may also further include a phase detector operable to generate a phase adjustment signal to the first data conversion circuit. The clock circuit also includes a loop filter, a charge pump, a Voltage Controlled Oscillator (VCO), and a divider.

The VCO includes a pair of cross-coupled transistors, an inductor coupled to the cross-coupled transistors, and a filtering circuit having a capacitor and a variable resistor, wherein the filtering circuit reduces noise contained within signals provided to the VCO. The variable resistor within the filtering circuit further acts as a voltage divider to reduce the voltage applied to the VCO. The noise filters may include 1/f noise, power supply noise, bias voltage noise or other like sources of noise. In another embodiment the filtering circuit associated with the VCO further includes band pass filter(s).

The first data conversion circuit may multiplex or demultiplex the first bit stream(s) into the second bit stream(s). Additionally, a second data conversion circuit may receive the second bit stream(s) and multiplex or demultiplex the second bit stream(s) into a third bit stream(s). When multiplexing the number of the third bit stream(s) is less than the number of the second bit stream(s), and the bit rate of the third bit stream(s) exceeds the bit rate of the second bit stream(s). When demultiplexing the number of the third bit stream(s) exceed the number of the second bit stream(s), and the bit rate of the second bit stream(s) exceeds the bit rate of the third bit stream(s). A selectable forward/reverse clock relationship may exist between the first data conversion data conversion circuit and the second data conversion circuit.

Another embodiment provides a clock circuit that produces a Reference Clock Signal used to latch data between first bit stream(s) and second bit stream(s), wherein the number and bit rate of the first bit stream(s) and the second bit stream(s) differ. This clock circuit includes a phase locked loop (PLL) having a phase detector that receives a plurality of inputs that include a first bit stream data clock and a loop output. The clock circuit's inputs may further comprise a Loop Timing Clock Signal; an External Reference Clock Signal; or a Reverse Clock Signal provided by an external data conversion circuit. The PLL further includes a loop filter, a charge pump, a Voltage Controlled Oscillator (VCO), and a divider.

The VCO in this embodiment comprises a pair of cross-coupled transistors, an inductor coupled to the cross-coupled transistors, and a filtering circuit having a capacitor and a variable resistor. In other embodiments, the filtering circuit may further include band pass filter(s) to additionally reduce noise. The clock filtering circuit reduces noise contained within a bias voltage provided to the VCO, reduces 1/f noise, or filters other noise contained within signals provided to the VCO such as power supply noise. The clock variable resistor within the filtering circuit acts as a voltage divider to reduce the voltage applied to the VCO.

Yet another embodiment provides a method of producing a Reference Clock Signal, within a clock circuit, wherein the Reference Clock Signal is used to latch data between first bit stream(s) and second bit stream(s), wherein the number and bit rate of the first bit stream(s) and the second bit stream(s) differ. This method generates with a VCO one of a number of inputs to a PLL within the clock circuit. At a minimum, these inputs include a first bit stream data clock. Additionally, these inputs may further include a Loop Timing Clock Signal, an External Reference Clock Signal, and/or a Reverse Clock Signal for the PLL. The input provided by the VCO make up a VCO Output Signal wherein a filtering circuit reduces noise contained within the VCO Output Signal. The filtering circuit includes a capacitor and a variable resistor.

A single input is selected from the number of inputs to the PLL from which the Reference Clock Signal will be generated. Finally, the Reference Clock Signal is generated from the selected input. The Reference Clock Signal generated within these embodiments may be used within a multistage data conversion circuit to multiplex or demultiplex a first bit stream(s) to a second bit stream(s).

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

FIG. 9 is a table and a diagram that illustrate operating specifications for the RX interface between the RX data demultiplexer circuits of FIG. 3;

FIG. 11 includes timing diagrams illustrating the set up and hold operations on the 4 bit wide×10 GBPS links between the RX data demultiplexer circuits of FIG. 3.

DETAILED DESCRIPTION OF THE INVENTION

Figure 1:
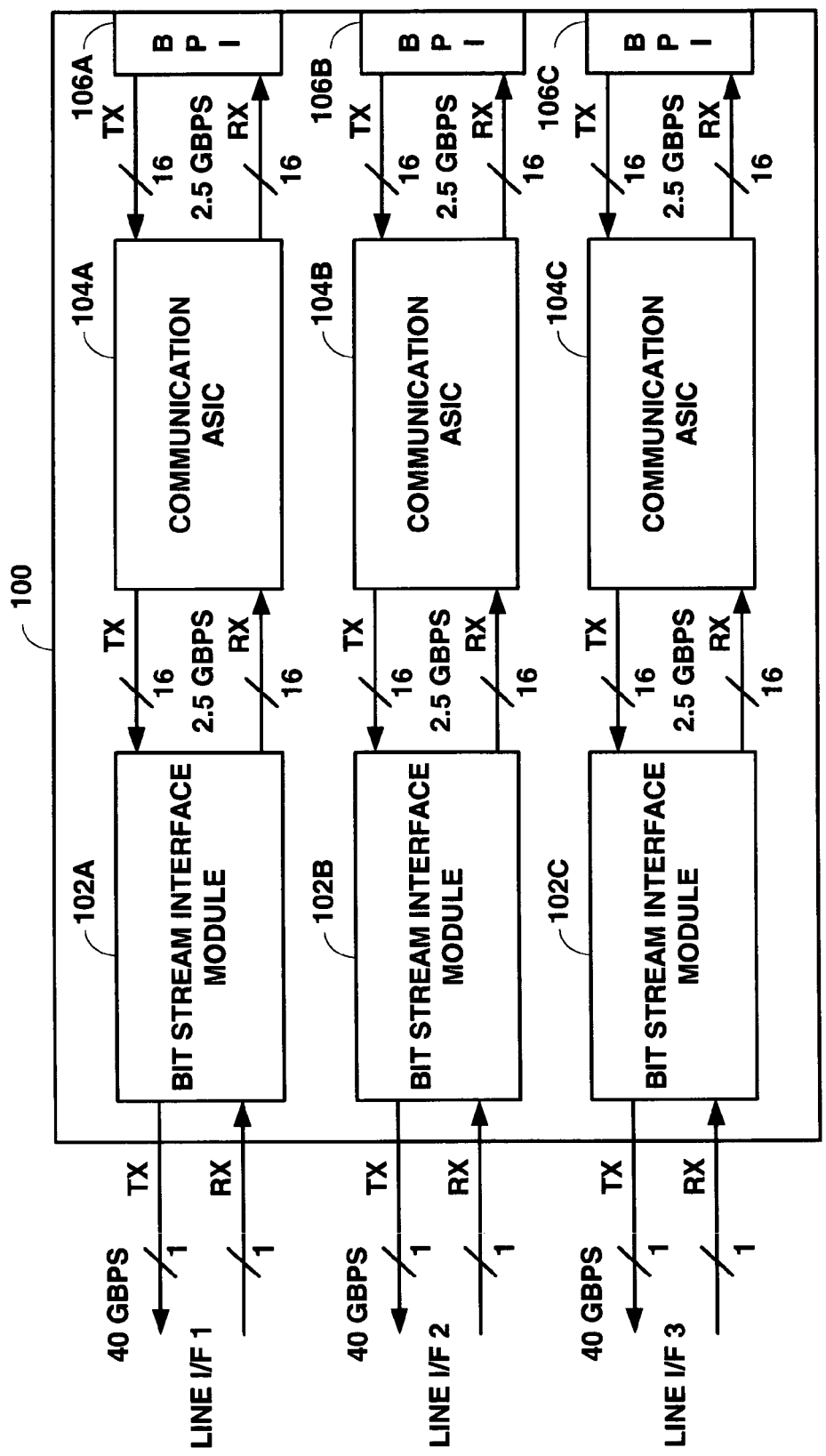
FIG. 1 is a block diagram illustrating a Printed Circuit Board (PCB) that has mounted thereon a plurality of Bit Stream Interface Module (BSIMs) constructed according to the present invention.

FIG. 1 illustrates with a block diagram a Printed Circuit Board (PCB) that has mounted thereon a number of Bit Stream Interface Module (BSIMs) constructed according to the present invention. As shown in FIG. 1, PCB 100 includes BSIMs 102A, 102B and 102C. PCB 100 also includes mounted thereupon communication Application Specific Integrated Circuits (ASIC) 104A, 104B, and 104C. PCB 100 mounts within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported. Communication ASIC 104A through 104C may communicate with other PCB components located in the housing via back interfaces 106A through 106C.

BSIMs 102A through 102C may be removably mounted upon PCB 100. In such case, if one of the BSIMs 102A through 102C fails it may be removed and replaced without disrupting operation of other devices on PCB 100. When BSIMs 102-102C are removably mounted upon PCB 100 and received by a socket or connection coupled to PCB 100. Further, in such embodiment, BSIMs 102A-102C may be constructed on a separate PCB.

Figure 2A:
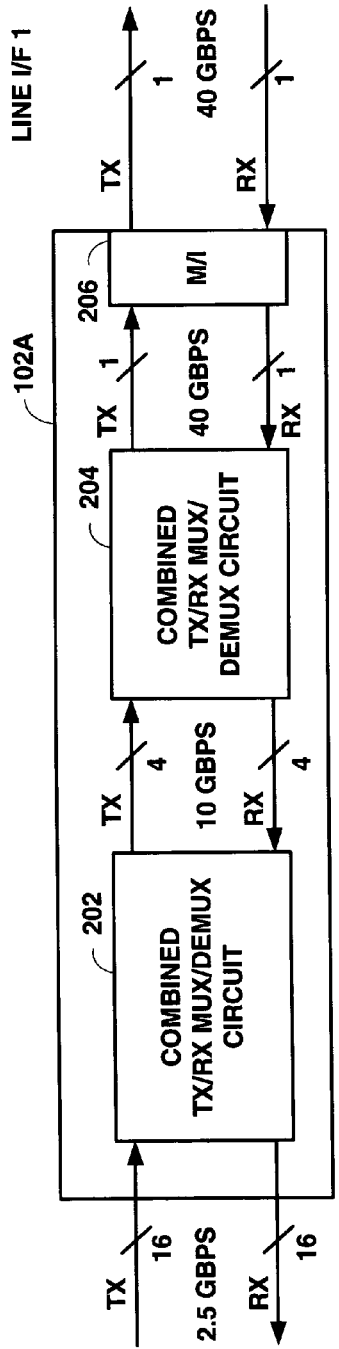
FIG. 2A is a block diagram illustrating one embodiment of a BSIM constructed according to the present invention.

FIG. 2A provides a block diagram illustrating one embodiment of BSIM 102A. BSIM 102A of FIG. 2A includes a first combined TX/RX multiplexer/demultiplexer circuit 202 and a second combined TX/RX multiplexer/demultiplexer circuit 204. On the line side of BSIM 102A, first combined TX/RX multiplexer/demultiplexer circuit 202 couples to a media, e.g., fiber optic cable or copper cable, via a media interface 206. Media interface 206 couples to combined TX/RX multiplexer/demultiplexer circuit 204 via a 40 GPS nominal bit rate, one bit transmit and one bit receive interface. TX and RX line medias themselves each support one bit 40 Giga bits-per-second (GBPS) nominal bit rate communications, such as is defined by the OC-768 and/or SEC 768 specifications of the OIF.

Combined TX/RX multiplexer/demultiplexer circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16*2.5 GBPS). The interface between combined TX/RX multiplexer/demultiplexer circuit 202 and combined TX/RX multiplexer/demultiplexer circuit 204 includes 4 TX bit lines and 4 RX bit lines, each operating at a nominal rate of 10 GBPS. This interface supports a nominal total throughput of 40 GBPS (4*10 GBPS). This interface may operate substantially or fully in accordance with an operating standard known as the Q40 operating standard. However, the teachings of the present invention are not limited to according to operation of the Q40 standard or is the description here intended to be a complete description of the Q40 standard itself.

Figure 2B:
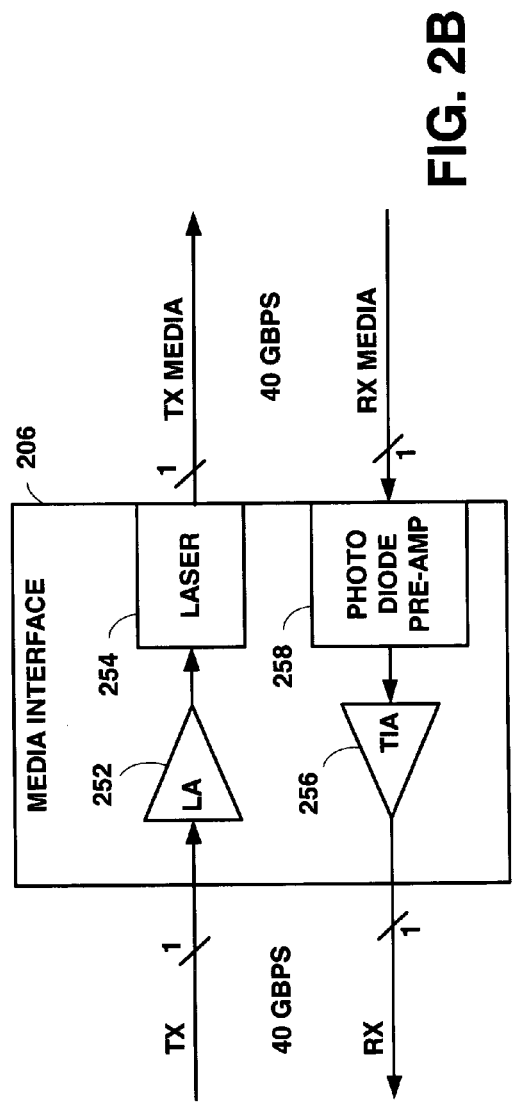
FIG. 2B is a block diagram illustrating an optical media interface that may be included wit the BSIM of FIG. 2A.

FIG. 2B provides a block diagram illustrating an optical media interface that may be included with the BSIM of FIG. 2A. As shown in FIG. 2B, media interface 206 couples to an optical media on a first side and couples to the combined TX/RX multiplexer/demultiplexer circuit 204 on a second side. In the transmit path, media interface 206 receives a single bit stream at a nominal bit rate of 40 GBPS from combined TX/RX multiplexer/demultiplexer circuit 204. Limiting amplifier 252 amplifies the TX bit stream to produce a bit stream output coupled to laser 254. The laser produces an optical signal that is coupled to TX optical media.

On the receive side, an RX optical media produces the RX bit stream at a nominal bit rate of 40 GBPS. Photo diode/pre-amplifier combination 258 receives the RX bit stream and produces an output for transimpedance amplifier 256. Transimpedance amplifier 256 then outputs a single bit stream at a nominal bit rate of 40 GBPS for combined TX/RX multiplexer/demultiplexer circuit 204 of FIG. 2A.

Figure 3:
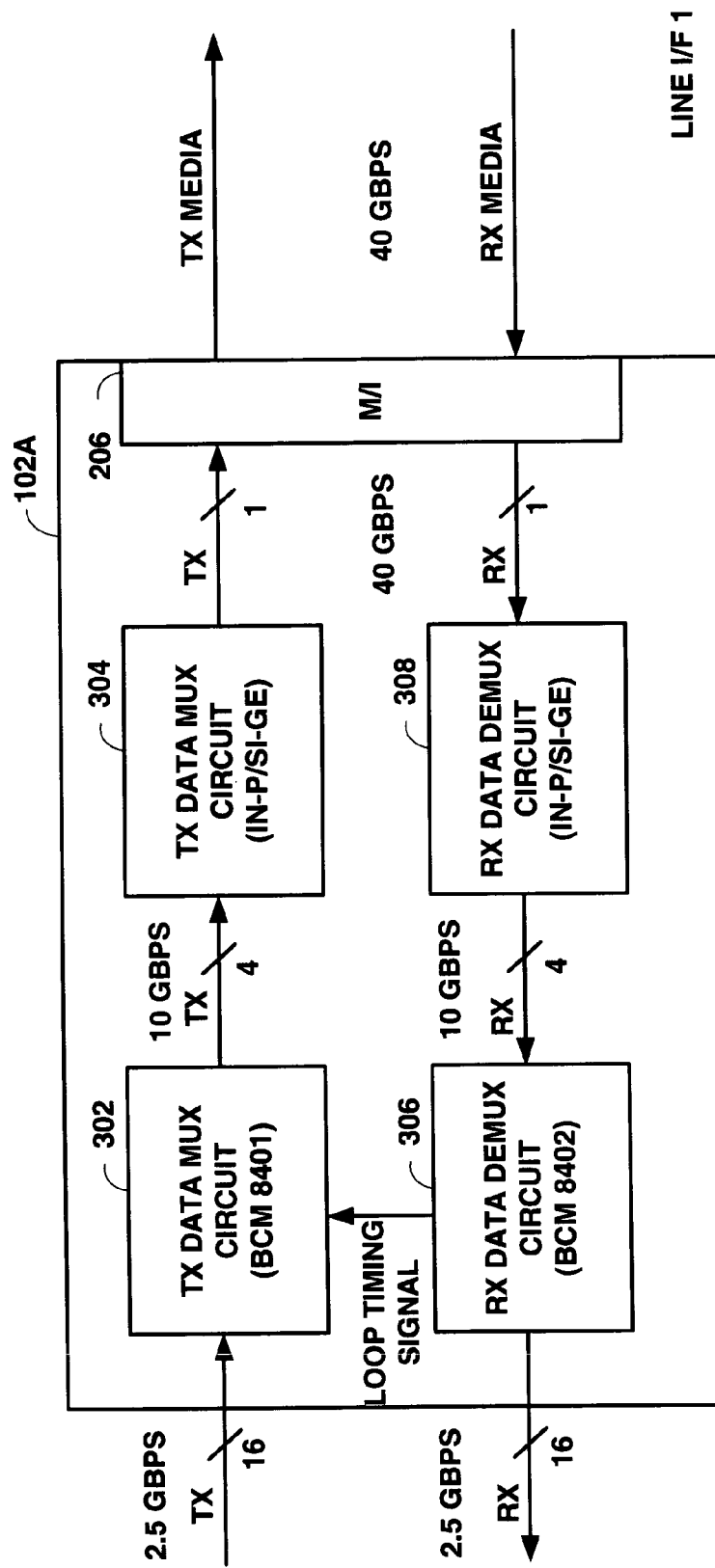
FIG. 3 is a block diagram illustrating another embodiment of a BSIM constructed according to the present invention.

FIG. 3 illustrates with a block diagram another embodiment of a BSIM. The embodiment shown in FIG. 3 differs from the embodiment of FIG. 2A in that separate TX and RX circuit components are employed. While media interface 206 of FIG. 3 is shown to be a single device such as shown in FIG. 2B, in other embodiments, the media interface 206 may be formed in separate circuits corresponding to separate TX and RX paths shown in FIG. 2B.

In the TX path, TX data multiplexer circuit 302 receives a 16 bit wide by 2.5 GBPS nominal bit rate input from a coupled ASIC and produces a 4 bit wide×10 GBPS nominal bit rate TX output. In the embodiment described herein, TX data multiplexer circuit 302 is constructed in a Silicon CMOS process, for example in a 0.13 micron CMOS process. The TX data multiplexer circuit 302 multiplexes the 16 bit wide by 2.5 GBPS nominal bit rate input to produce a 4 bit wide 10 GBPS nominal bit rate output, which is received by the TX data multiplexer circuit 304. TX data multiplexer circuit 304 multiplexes the 4 bit wide×10 GBPS nominal bit rate output to produce a single bit wide output at a nominal bit rate of 40 GBPS.

TX data multiplexer circuit 304 must switch at a frequency that is at least four times the rate at which TX data multiplexer circuit 302 must switch. For this reason, TX data multiplexer circuit 304 is constructed in an Indium-Phosphate, Silicon-Germanium or other like process that supports these required higher switching rates at the 40 GBPS output of TX data multiplexer circuit 304. The combination of TX data multiplexer circuit 302 constructed in a CMOS process and TX data multiplexer circuit 304 constructed in an Indium-Phosphate, Silicon-Germanium or other like process provides a high performance, relatively low cost solution with which to interface a 2.5 GBPS nominal bit rate 16 bit wide interface and a 40 GBPS 1 bit wide interface.

Likewise, in the RX path, bit stream interface module 102A includes an RX data demultiplexer circuit 308 that receives a single bit stream at a nominal bit rate of 40 GBPS data. RX data demultiplexer circuit 308 produces a 4 bit wide×10 GBPS nominal bit rate output for RX data demultiplexer circuit 306. In turn, RX data demultiplexer circuit 306 produces a 16 bit wide×2.5 GBPS nominal bit rate receive data stream.

As was the case with TX data multiplexer circuit 302 and TX data multiplexer circuit 304, RX data demultiplexer circuit 306 and RX data demultiplexer circuit 308 are formed in differing process types. In particular RX data demultiplexer circuit 306 is constructed in a Silicon CMOS or other like process that supports the relatively low switching rates. Further, RX data demultiplexer circuit 308 is constructed in an Indium-Phosphate, Silicon-Germanium, or other like process that supports the higher switching speeds.

Figure 4A:
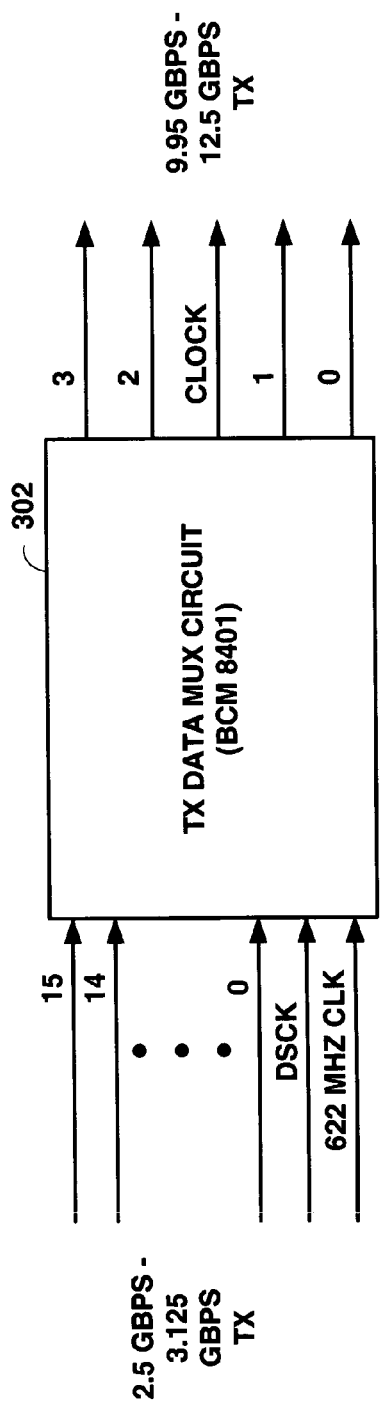
FIG. 4A is a block diagram illustrating a TX data multiplexer circuit constructed according to the present invention.

FIG. 4A depicts a block diagram that illustrates a TX data multiplexer circuit. As shown in FIG. 4A, TX data multiplexer circuit 302 receives 16 bit steams of data at nominal bit rate of 2.5 GBPS on each bit line from the communication ASIC 104A. Each bit line of this 16 bit wide interface operates at bit rates of up to 3.125 GBPS. This interface also includes a DSCK clock and 622 MHz clock. The output of the TX data multiplexer circuit 302 includes 4 bit lines, each of which supports a nominal bit rate of 10 GBPS. However, the output of the TX data multiplexer circuit can produce data at bit rates between about 9.95 GBPS and 12.5 GBPS. TX data multiplexer circuit 302 also produces a clock signal at one-half the nominal bit rate of the 4 bit stream paths. In such case, when the nominal bit rate of the data paths is 10 GBPS, the clock will be produced at 5 GHz.

Figure 4B:
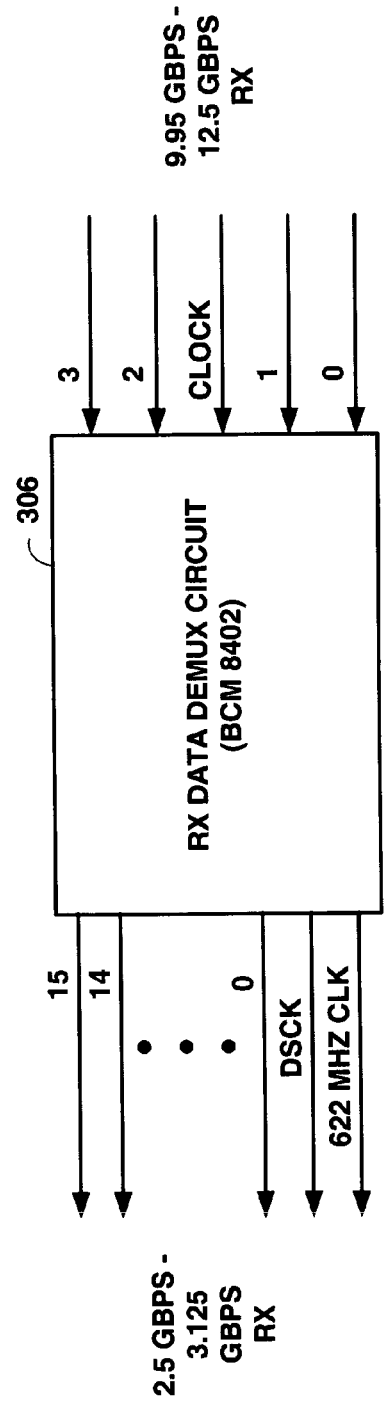
FIG. 4B is a block diagram illustrating an RX data demultiplexer circuit constructed according to the present invention.

FIG. 4B is a functional block diagram illustrating RX data demultiplexer circuit 306. As shown, RX data demultiplexer circuit 306 receives 4 bit streams at nominal bit rates of 10 GBPS each but operates between about 9.95 GBPS and 12.5 GBPS. RX data demultiplexer circuit 306 produces 16 bit stream outputs at a nominal bit rate of 2.5 GBPS. However, RX data demultiplexer circuit 306 may produce 16 bit streams output at a bit rate between about 2.25 GBPS and 3.125 GBPS.

Figure 5:
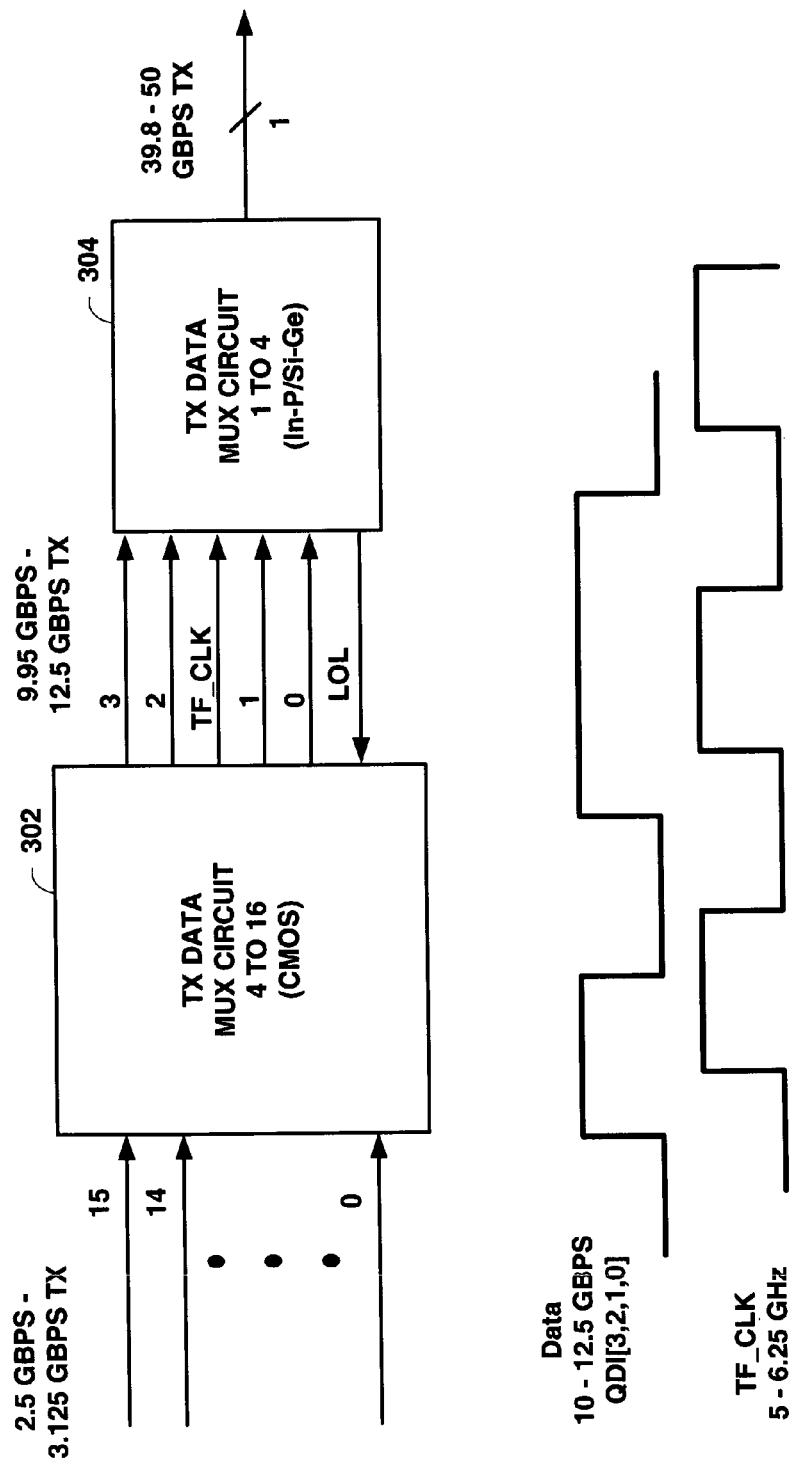
FIG. 5 is a block diagram illustrating the RX data demultiplexer circuits of FIG. 3 and the interfaces serviced thereby.

FIG. 5 is a block diagram depicting RX data demultiplexer circuit 306 coupled with RX data demultiplexer circuit 308 of FIG. 3 and the interfaces serviced thereby. As is shown in FIG. 5, RX data demultiplexer circuit 308 receives a single bit stream at a nominal bit rate of 40 GBPS. However, the single bit stream input may operate at bit rates between about 39.8 GBPS and 50 GBPS. Each RX data demultiplexer circuit performs a 1 to 4 demultiplexing operation on the received single bit stream to produce 4 output bit streams for each input bit stream. RX data demultiplexer circuit 308 produces output at bit rates between about 9.95 GBPS and 12.5 GBPS.

RX data demultiplexer circuit 306 receives 4 bit streams having nominal bit rates of 10 GBPS each, a QCLKI signal, and a RX_LOL signal from RX data demultiplexer circuit 308. Based upon these input signals, RX data demultiplexer circuit 306 produces 16 bit stream outputs at nominal bit rates of 2.5 GBPS. Also shown in FIG. 5, the QCLKI signal operates at one-half the frequency of the bit rate of the data stream received from RX data demultiplexer circuit 308. Thus, in such case, for the nominal bit rate of 10 GBPS, the QCLKI signal will be provided at 5 GHz.

Skewing often occurs because the clock and data are both generated externally to RX data demultiplexer circuit 306, and because the data and clock signals must travel over PC board traces that likely will have varying lengths and therefore varying parasitic loads. Skewing occurs between the clock QCLKI and data the 4 bit streams generated by circuit 308. Given the high speed at which these inputs operate, there is very little room for delay caused by mismatches between the clock and data signals. Without a signal delay method, the clock data relationship cannot be guaranteed to comport with the specifications established for that relationship. Further, because each of the data paths is unique across the PCB, it is highly likely that, even though the RX data demultiplexer circuit 308 produces data that is aligned upon transmission, the data will not be aligned upon receipt by the RX data demultiplexer circuit 306.

Figure 6A:
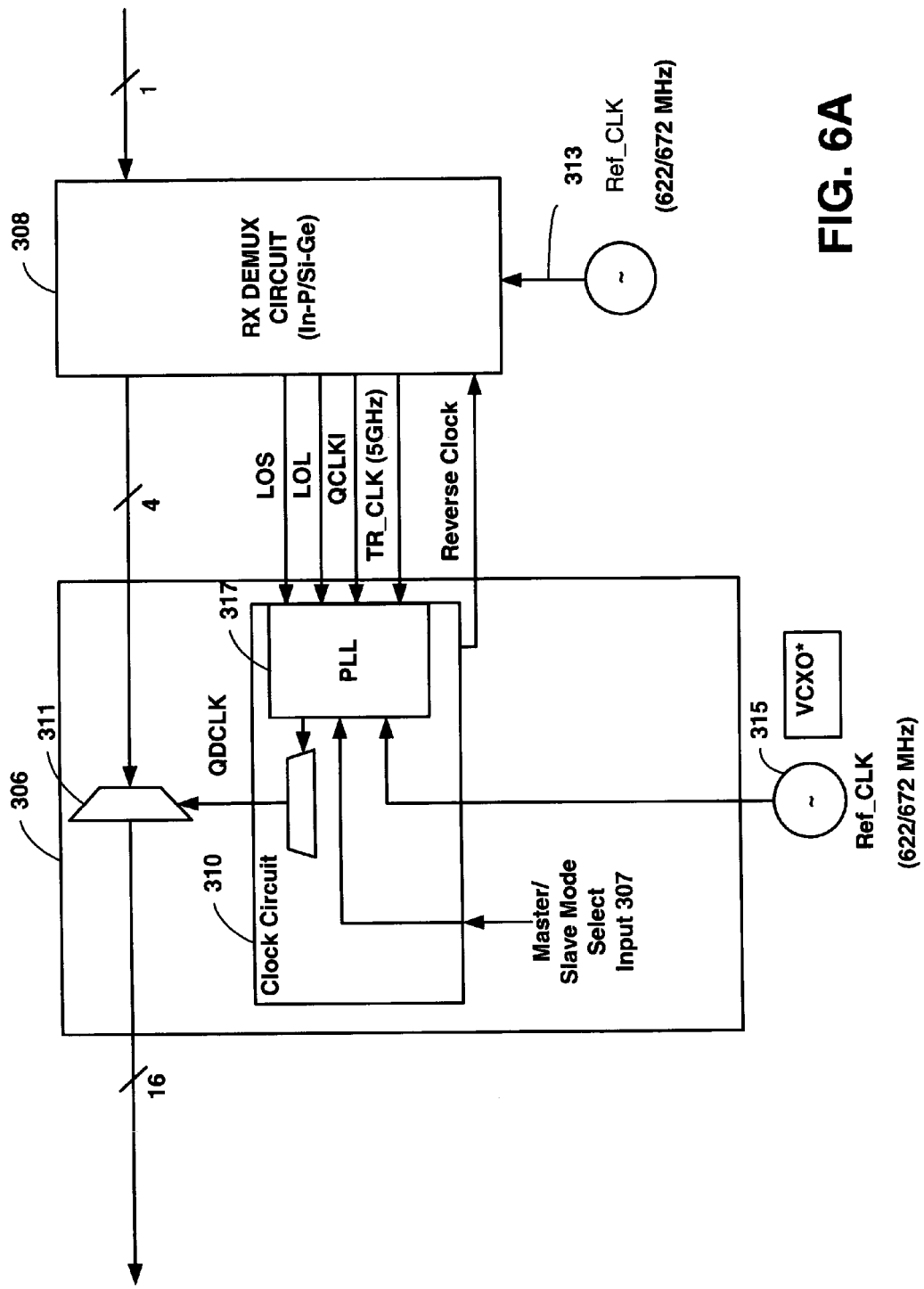
FIGS. 6A-6C depict multistage data conversion circuits that utilize a VCO.

FIG. 6A illustrates that RX data demultiplexer circuit 306 and RX data demultiplexer circuit 308 each can be configured to operate as a master or slave. It may be desirable to operate RX data demultiplexer circuit 306 as a slave because such a configuration would make the combination extremely responsive to changes in the media signal. In the slave mode, the clocked operation of RX data demultiplexer circuit 306 is completely controlled by the transmit data clock QCLKI. Master/slave mode select input 307 is forced to a binary state that selects transmit data clock QCLKI as the direct source of the Receive Data Clock QDCLK through demultiplexer 311.

In this configuration, RX data demultiplexer circuit 308 must police the generation of transmit data clock QCLKI. The transmit data clock QCLKI generates based on a clock recovered from the data received over the 40 GBPS bit stream. If the signal is lost, interrupted or compromised, the recovered clock is no longer reliable from which to provide the QCLKI. Because data is in the process of being demultiplexed, the QCLKI should not be interrupted. Thus, an oscillator or reference clock 313 is provided from which the transmit data clock may be derived (i.e. using a PLL which is not shown) when a Loss of Signal (LOS) or Loss of Lock (LOL) occurs.

It may also be desirable to operate RX data demultiplexer circuit 306 in the master mode. This configuration permits RX data demultiplexer circuit 308 to be simplified and streamlined as much as possible. Since integrated circuit manufacture using an In-P or Si-Ge process is more expensive than Si-CMOS manufacture, circuit 308 can be simplified to reduce cost and increase manufacturing yields.

In one scenario, the master/slave mode select is forced to the opposite state to place RX data demultiplexer circuit 306 into the master mode. In this case, the demultiplexer 311 does not bypass the PLL, and instead QDCLK derives from the PLL Data Clock. PLL Data Clock generates from QCLKI, an oscillator, or other reference clock. In normal operations, PLL Data Clock will be based on the QCLKI. However, if can LOS occurs indicating that QCLKI is no longer valid, or that the signal has been interrupted, PLL 317 immediately begins to derive PLL Data Clock from oscillator or reference clock 315. This action can also be taken in response to loss of lock (LOL) signal, which indicates that QCLKI is no longer locked with the data streams being transmitted.

RX data demultiplexer circuit 306 also includes the ability to use PLL 317 and associated logic circuits to monitor frequency deviation between QCLKI and other references to produce a phase adjustment signal necessary to reduce the frequency deviation. This adjustment occurs when the frequency deviation exceeds a predetermined level. Thus, RX data demultiplexer circuit 306 may interface with upstream RX data demultiplexer circuit 308 acting in a master mode to ensure quick reaction to changes in the media input, or to act itself in the master mode and handle the complexities of clock generation and alignment.

Since clock and data both generate externally to RX data demultiplexer circuit 306, and because the data and clock signals travel over PC board traces having varying lengths and parasitic loads, there is a very strong potential for skewing to occur between the clock QCLKI and data the 4 bit streams generated by InP circuit 308. Given the high speed at which these inputs operate, little room exists for delay caused by mismatches between the clock and data signals. Signal delay methods can operate to guarantee that the clock data relationship will comport with the specifications established for that relationship. Further, each vague data path across the PCB may produce data that is not aligned upon receipt by RX data demultiplexer circuit 306.

Figure 6B:
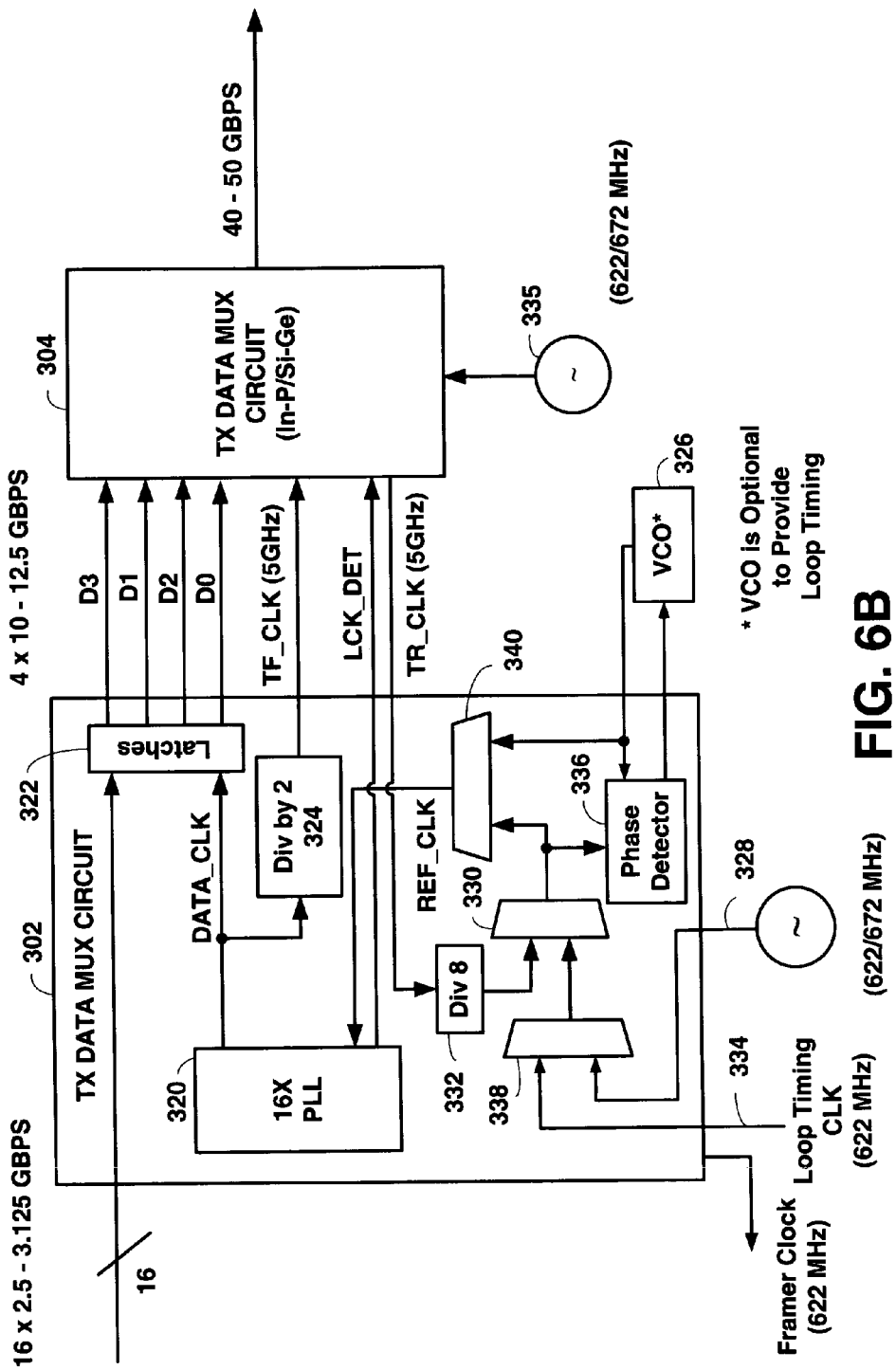

FIG. 6B illustrates in more detail the manner in which the clocks are generated for TX data multiplexer circuit 302 and TX data multiplexer circuit 304. The forward transmit clock, TF_CLK, derives from an internal reference clock REF_CLK, wherein the reference clock is based on one of many selectable inputs. These inputs will be described more detail following a discussion of the PLL 320. PLL 320 multiplies REF_CLK by 16 to produce DATA_CLK. DATA_CLK clocks multiplexed data into latches 322, the outputs of which produce 4-bit streams D0-D3. As previously discussed, bit streams D0-D3 have a data rate of between 10 and 12.5 GBPS. Thus, DATA_CLK has a frequency that is equal to the data rate of the bit streams it is producing by latching multiplexed data onto D0-D3. Circuit 324 divides DATA_CLK to produce TF_CLK at half the frequency, and which is source centered with respect to the data being latched onto D0-D3.

REF_CLK can be derived from a number of reference sources or selectable inputs based on selections made at multiplexers 330, 338, and 340. Oscillator reference clock 328 can be the source of REF_CLK with the requisite select input values. In that case, DATA_CLK will be 16 times the frequency supplied by the external oscillator. This frequency can range from 622 to 672 MHz. Similarly, loop-timing clock 334, provided by RX data demultiplexer 306, also at about 622 MHz., can be selected depending on the inputs to circuit 338. Typically, the loop timing clock 334 serves as a reference for a phase locked loop (PLL) that is made up of VCO 326, and phase detector 336. The phase detector 336 determines any phase difference between loop timing clock 334 and the output of VCO 326.

REF_CLK can also be derived from reverse clock TR_CLK that is, like the TF_CLK, about 5 GHz in frequency. The TX data multiplexer circuit 304 using a crystal oscillator 335 at 622 to 672 MHz generates TR_CLK. A PLL on board the TX data multiplexer circuit 304 multiplies the 622 MHz clock to 5 GHz. Inside TX data multiplexer 302, circuit 332 divides reverse clock TR_CLK by 8. This signal, when multiplied by 16 and phase aligned by PLL 320, produces 10 GHz DATA_CLK and the forward transmit clock TF_CLK, when divided by 2. Those of average skill in the art will recognize that it may be advantageous to have the reference clock REF_CLK generated on a different integrated circuit, such as the TX data multiplexer circuit 304.

The PLL 320 produces an output LCK_DET that remains active when PLL 320 is phase locked with the reference clock, REF_CLK. This output signal can be provided as an input to the TX data multiplexer circuit 304. If the REF_CLK is generating from either the VCO 326 or the oscillator reference output 328, and the PLL loses its lock for greater than a predetermined time, inputs at multiplexer 330 may choose reverse transmit clock, TR_CLK, which is divided down by circuit 332, as the reference clock REF_CLK for PLL 320. This ensures continued operation if for example, the oscillator producing output 328 or the VCO 334 becomes inoperative or otherwise malfunctions. The multistage multiplexer described may chose one of several inputs for the reference clock used to latch data. Additionally, an upstream or first stage multiplexer having this ability may in fact couple to downstream or second stage multiplexers less capable than the one shown.

Figure 6C:
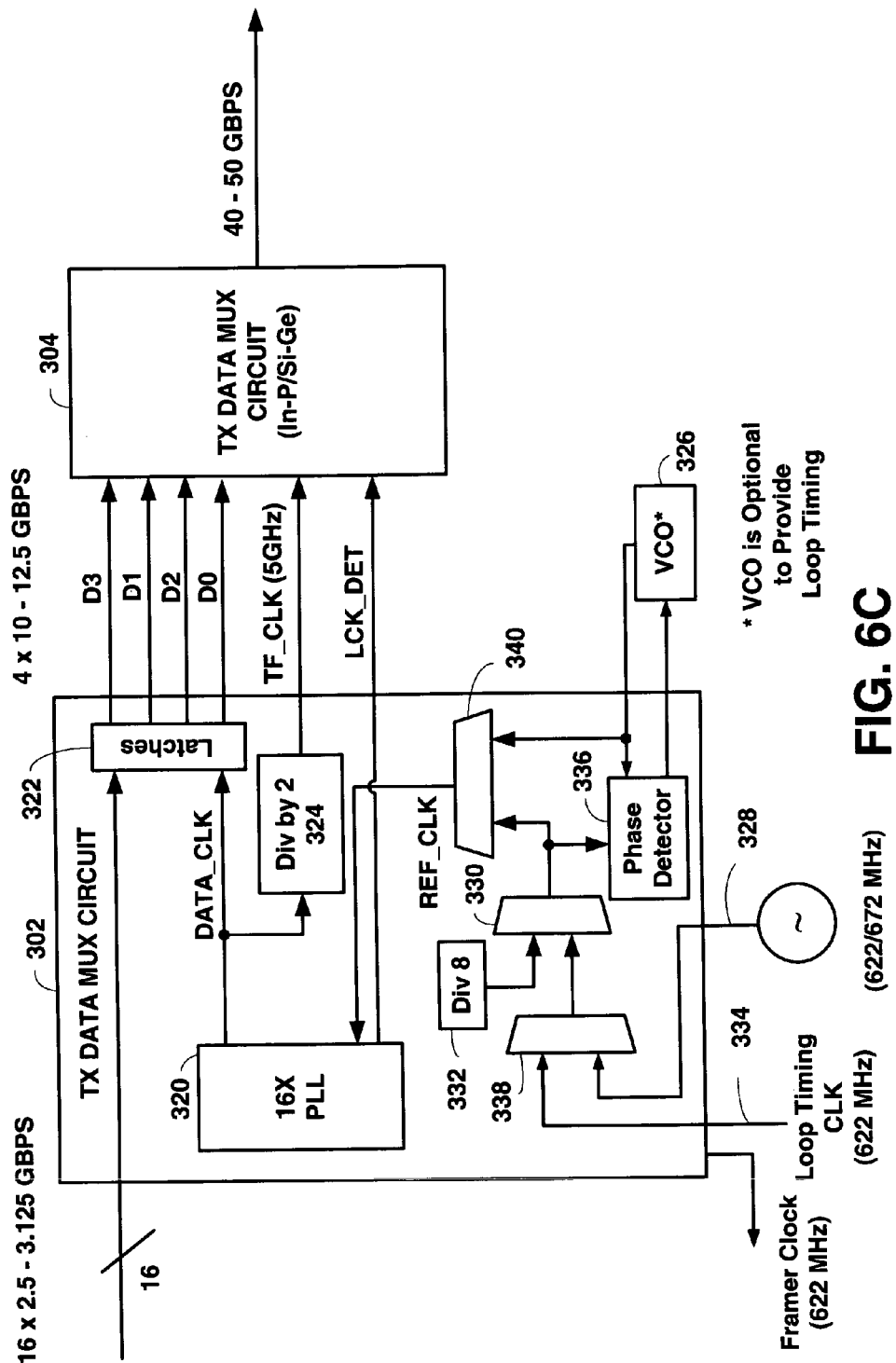

FIG. 6C depicts an embodiment where TX data multiplexer 302 couples to a less capable downstream TX data multiplexer 304. Here, TX data multiplexer 304 does not produce a reverse clock. Removing this functionality from the downstream multiplexer allows the circuit formed in processes that support higher switch rates to be simplified. This simplification improves manufacturing yield and reduces manufacturing cost associated with these circuits that support higher switching rates. Further, this embodiment demonstrates the increased versatility of the upstream multiplexer taught within this disclosure.

Figure 7A:
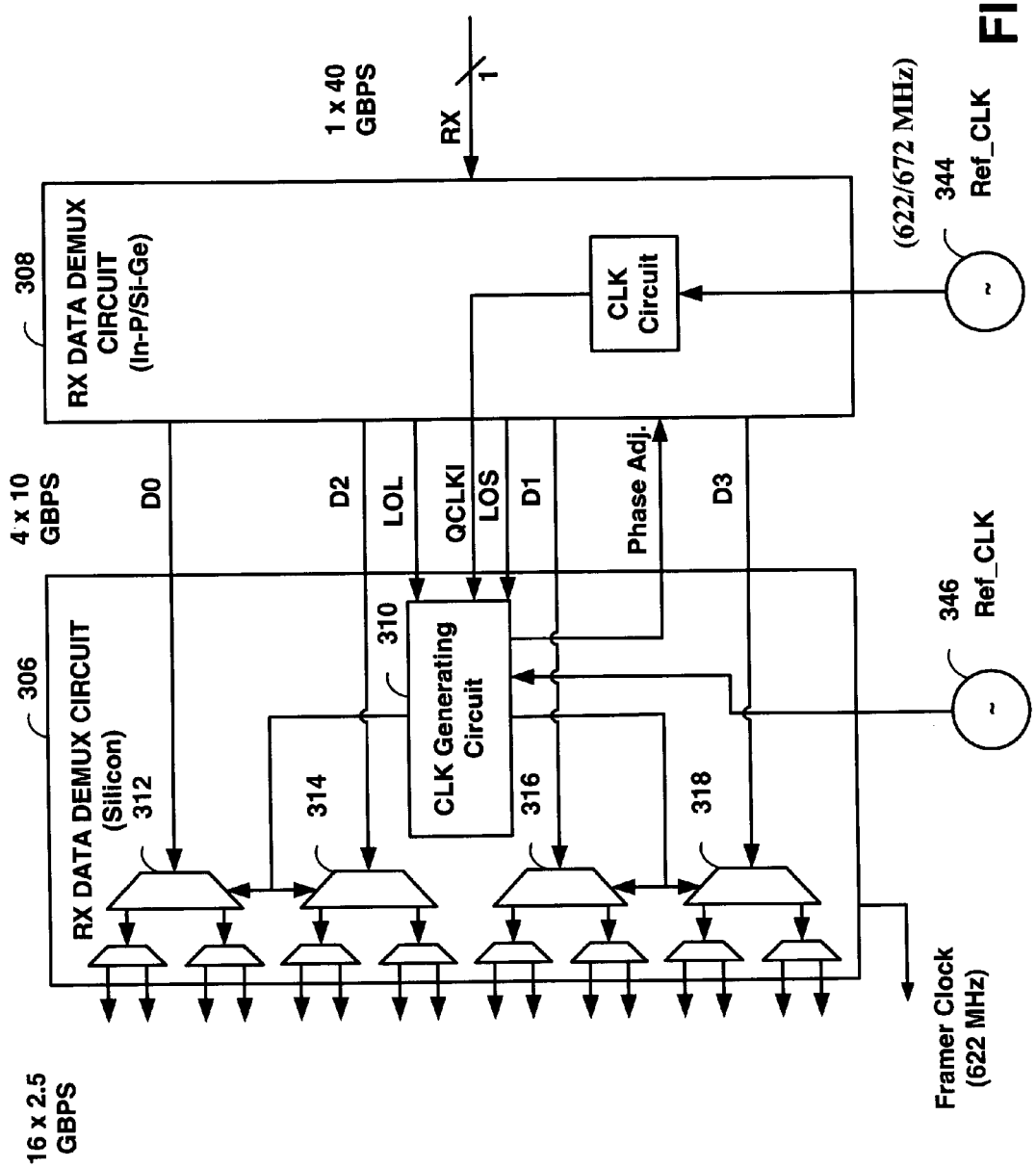
FIGS. 7A and 7B depict multistage demultiplexer circuits that utilize a VCO within a clock circuit.

As shown in the block diagram provided in FIG. 7A, a "smart" demultiplexer circuit 308 receives a high data rate signal, such as a 40 GBPS signal. Staging the demultiplexing process between demultiplexer circuits 306 and 308 allows the complexity of the high performance circuits (higher switching rate capable circuit) contained within demultiplexer 308 to be minimized. However, as shown in FIG. 7A, reference clock generation may occur within demultiplexer 308. Simplifying demultiplexer 308 allows power consumption, complexity and the number of gates previously located within demultiplexer circuit 308 to be shifted to lower technology and less expensive demultiplexer circuit 306. This division achieves an improved power consumption and reduced cost of manufacture. The functions within demultiplexer circuit 308 may be minimized, being limited to only those processes requiring higher performing circuits. It should be noted that, although a relatively exotic and high-performing technology is depicted in this embodiment of demultiplexer circuit 308, one should realize that Si CMOS processes or other similar technologies may be used for both demultiplexer circuits 306 and 308.

Figure 7B:
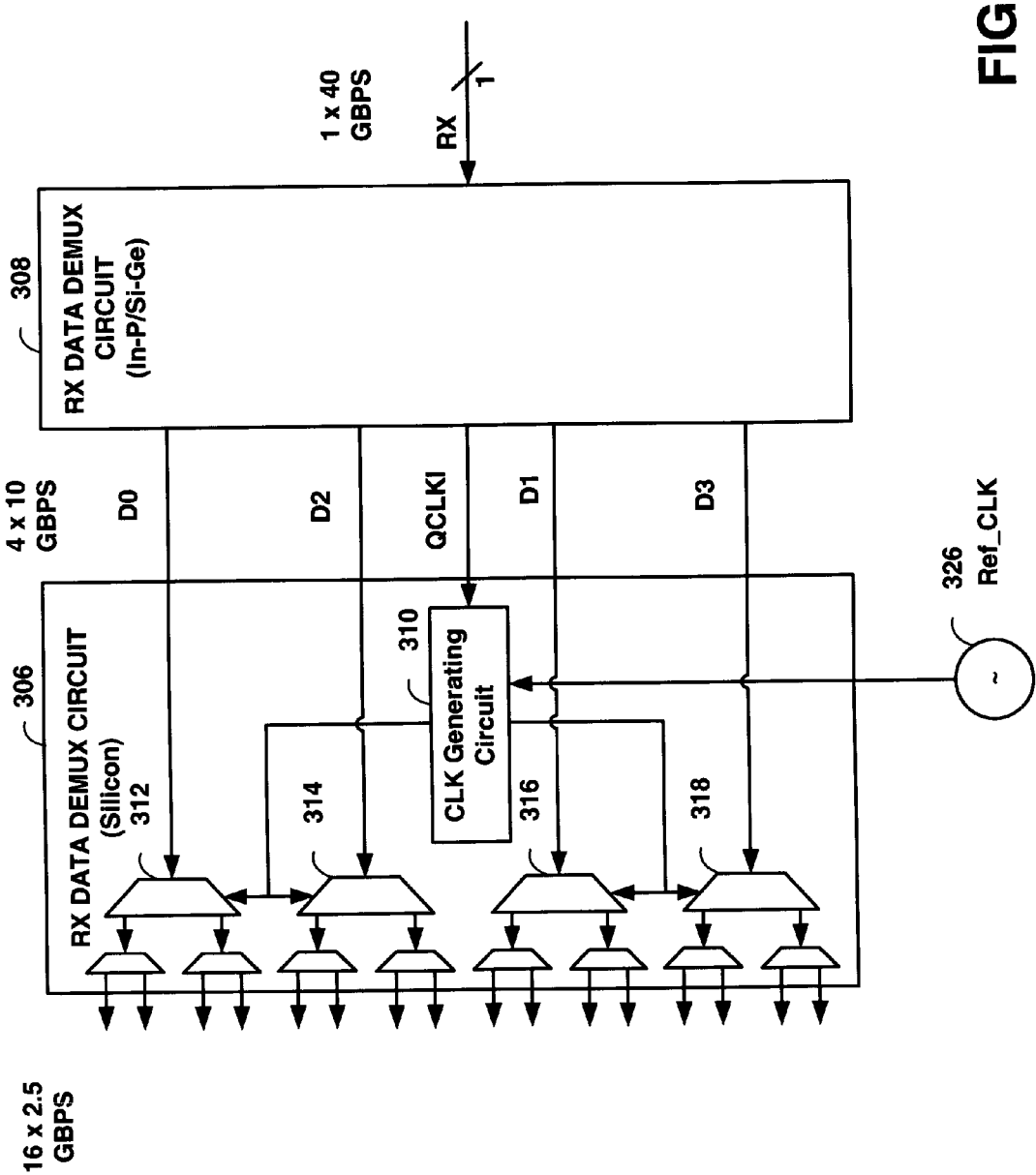

FIG. 7B depicts an instance where demultiplexer circuit 306 acts in a master role with respect to "dumb" demultiplexer circuit 308. In this embodiment, as many functions of the clock circuitry as possible are transferred from demultiplexer circuit 308. This reduces the complexity and cost of demultiplexer 308. When operating in the master mode, the clock circuit 310 generates a clock signal based upon an internal or external reference clock signal such as that provided by reference clocks 344 and 346. A crystal oscillator or similar circuit known to those skilled in the art may also generate this signal. Clock circuit 310 generates a clock signal from an internal or external reference that here does not need to originate within demultiplexer circuit 308. The operation of demultiplexer circuit 306 in either a master or slave mode may be directed by input selector 307 to set the operation of demultiplexer circuit 306 in either a master or slave mode with respect to upstream demultiplexer circuit 308.

Voltage Controlled Oscillators (VCOs) have a frequency of oscillation controlled by an input voltage and are useful in a number of applications. As seen in the previous Figures, the VCO may be used to provide various clock functions such as a reference clock or loop timing. There are many different clock applications described in the previous Figures where a VCO is utilized.

Figure 7C:
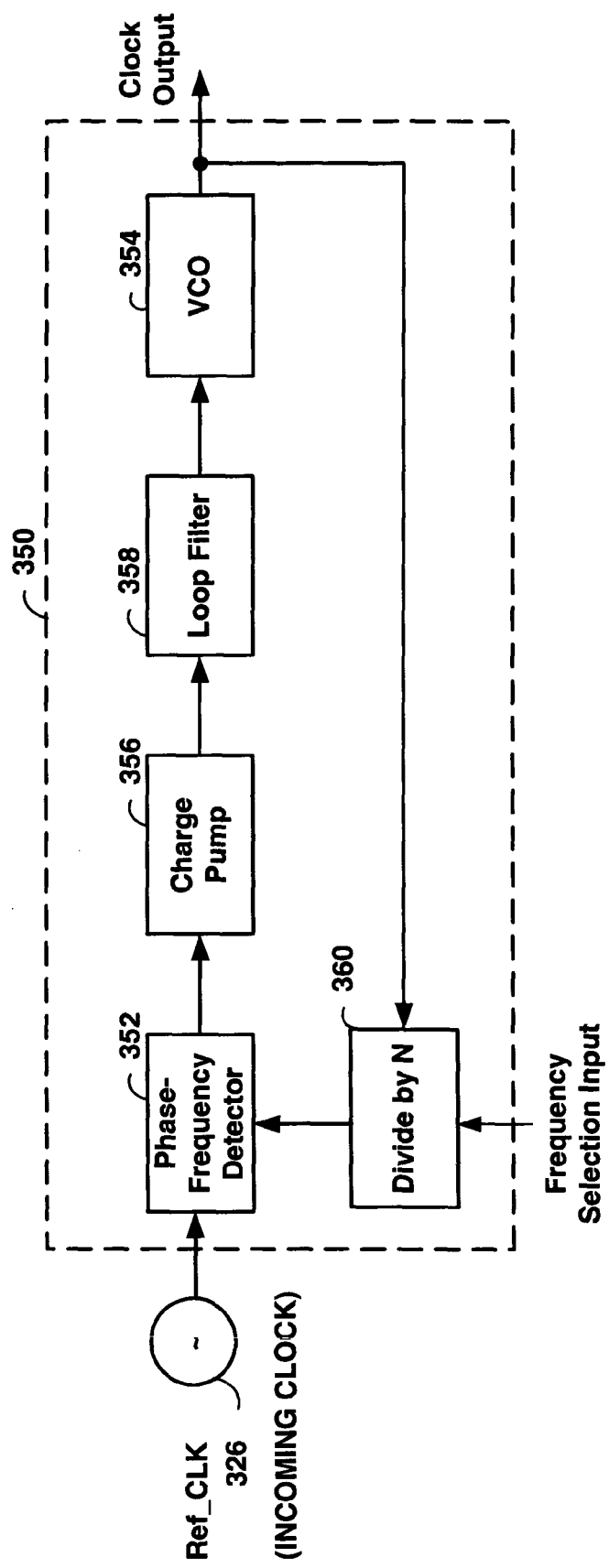
FIG. 7C is a block diagram illustrating an embodiment of a Phase Locked Loop that generates a clock signal and that includes a VCO constructed according one of a number of embodiments of the present invention.

FIG. 7C depicts a VCO incorporated into a PLL. A PLL forces the phase of the periodic signal at the output of its VCO to be approximately equal to the phase of the input signal. The only way these phases can be equal is for the frequencies of these signals to be equal as well. Therefore, a generic PLL guarantees that the frequency of the VCO is equal to that of its input. The use of a divider circuit allows the VCO frequency to be a multiple of that of the incoming signal. In FIG. 7C, PLL 350 receives an incoming clock signal such as that provided by reference clock 326. Phase detector 352 generates an error that is ideally proportional to the difference in phase between the loop input, INCOMING CLOCK, and the output of VCO 354. Loop filter 358 attenuates rapid variations in the error between the output of VCO 354 and the INCOMING CLOCK, and provides this input to charge pump 356. Divide by N circuit 360 accounts for difference in the VCO output and INCOMING CLOCK frequency.

The VCOs in FIGS. 8A-8D may be incorporated into a clock circuit used within the circuits associated with FIGS. 6A-6C and 7A-7C. In one embodiment the VCO is used to produce a Reference Clock Signal based on a number of inputs that include the first bit stream data clock, wherein the Reference Clock Signal latches data from the first bit stream(s). The inputs to the clock circuit may further include a Loop Timing Clock Signal; an External Reference Clock Signal; a Reverse Clock Signal provided by an external data conversion circuit; or other like signals. This clock circuit includes a phase locked loop (PLL) with a phase detector that receives the first bit stream data clock and a loop output.

Figure 8A:
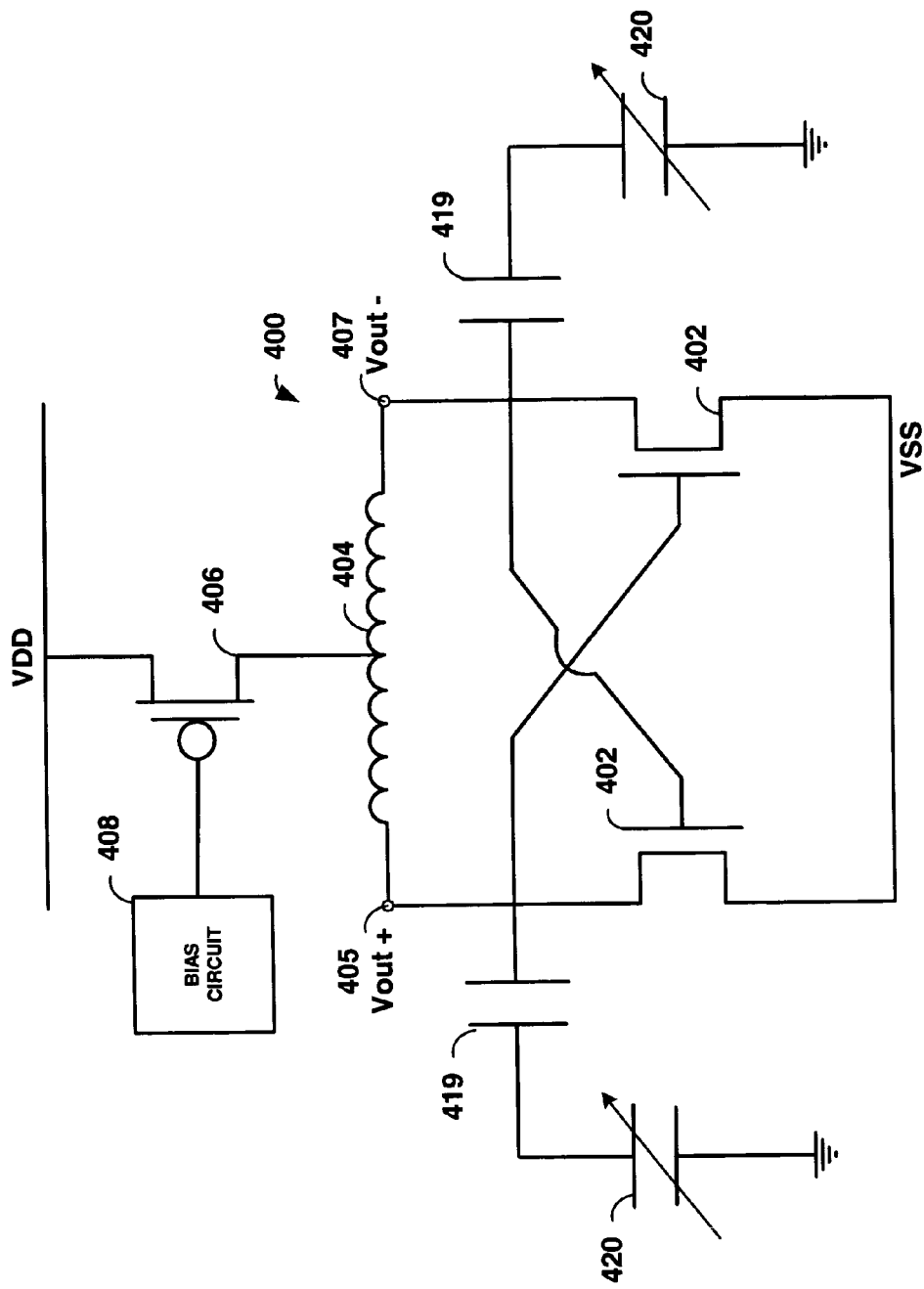
FIGS. 8A-8D depict various embodiments of VCOs used within clock circuits coupled to various embodiments of filtering circuits.

FIG. 8A illustrates a typical VCO comprising a pair of cross-coupled NMOS transistors 402 and an inductor 404. Although several VCOs are illustrated in FIGS. 8A-8D, other VCOs known to those skilled in the art may be used. Inductor 404 is coupled to the cross-coupled transistors 402 and the output of the VCO 400 is the differential across inductor 404 taken at terminals 405 and 407. Bias voltage to the circuit inputs via transistor 406. Any noise within the current supplied to inductor 404 affects the oscillation phase noise of the circuit. Thus, it is important to reduce noise associated with the supplied bias voltage, power supply or transistor 406. As previously discussed, such noise can adversely affect the VCO output signal. As shown, transistor 406 is a pFET type transistor, while transistors 402 are nFET type transistors. VCO 400 is subject to 1/f noise and white noise from transistor 406, bias voltage, and power supply. Varactors 420 are used to tune the VCO frequency. Capacitors 419 are ac-coupling capacitors that are mainly employed to isolate DC voltage from 405 and 407 to the varactors 420.

Figure 8B:
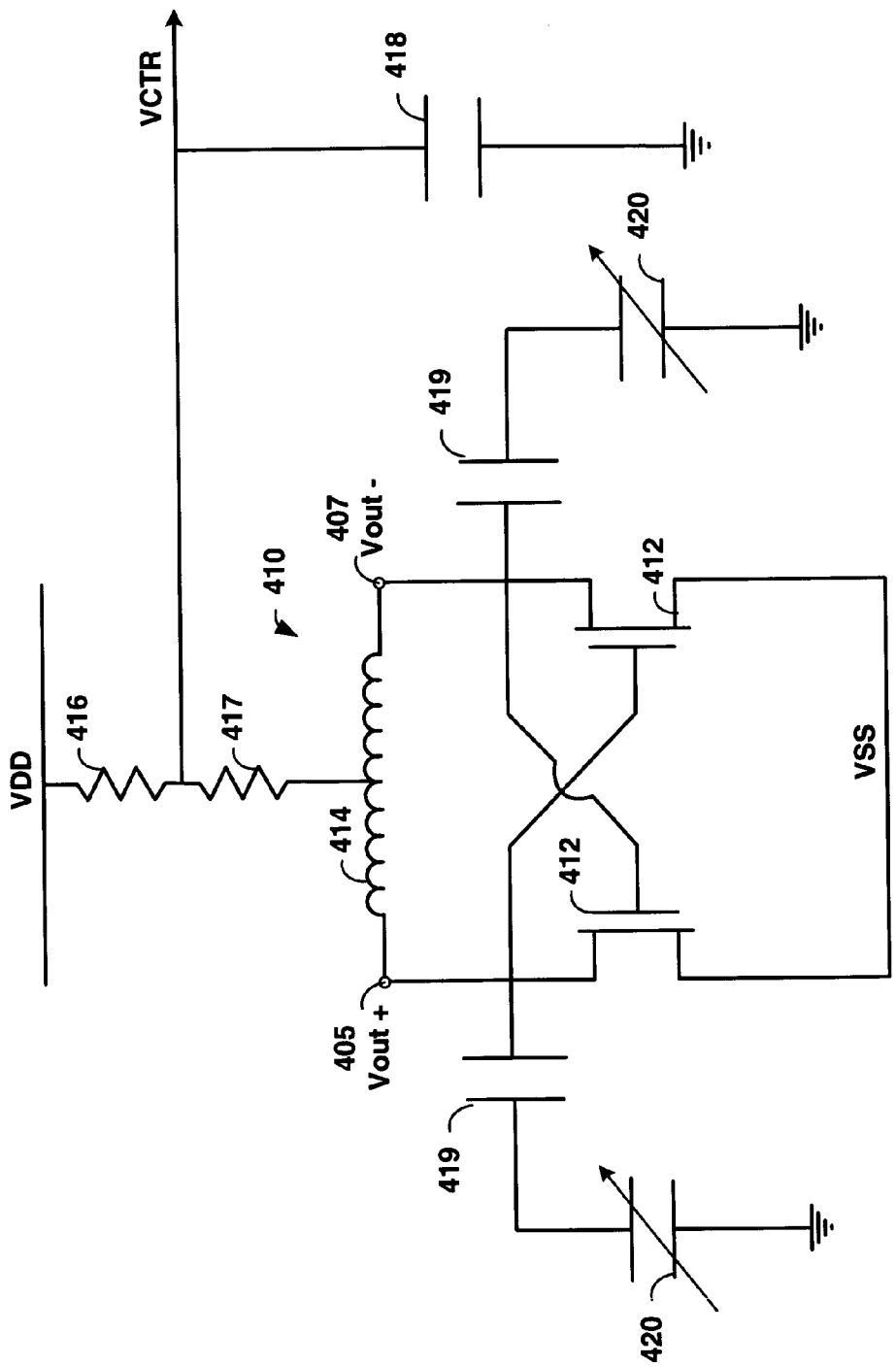

FIG. 8B depicts one embodiment wherein VCO 410 comprises a pair of cross-coupled NMOS transistors 412. The output of the VCO is taken across inductor 414 at terminals 405 and 407. As shown in FIG. 8B, a resister 416 and capacitor 418 form an RC filter to reduce noise associated with power supply inputted to VCO 410 Note that 1/f noise and white noise associated with the transistor 406 and its biases used to supply the bias current to VCO 400 as depicted in FIG. 8A does not exist in FIG. 8B. Additionally, the filtering node, VCTR, may be brought out of the chip to connect to a larger capacitor for better filtering. This clean voltage may be used as a clean control voltage for other purposes. As in FIG. 8A, the output of VCO 410 is taken as the differential across inductor 414. It is also important to note in FIG. 8B that the voltage applied to 410 between the inductor and VSS may be dropped or reduced by using resistor 417. This resistor also functions to raise the voltage at VCTR. As with FIG. 8A, it is important to reduce noise supplied to the circuit since such noise can adversely affect the VCO output signal. As stated above, capacitors 419 are ac-coupling capacitors that are mainly employed to isolate DC voltage from 405 and 407 to the varactors 420.

Figure 8C:
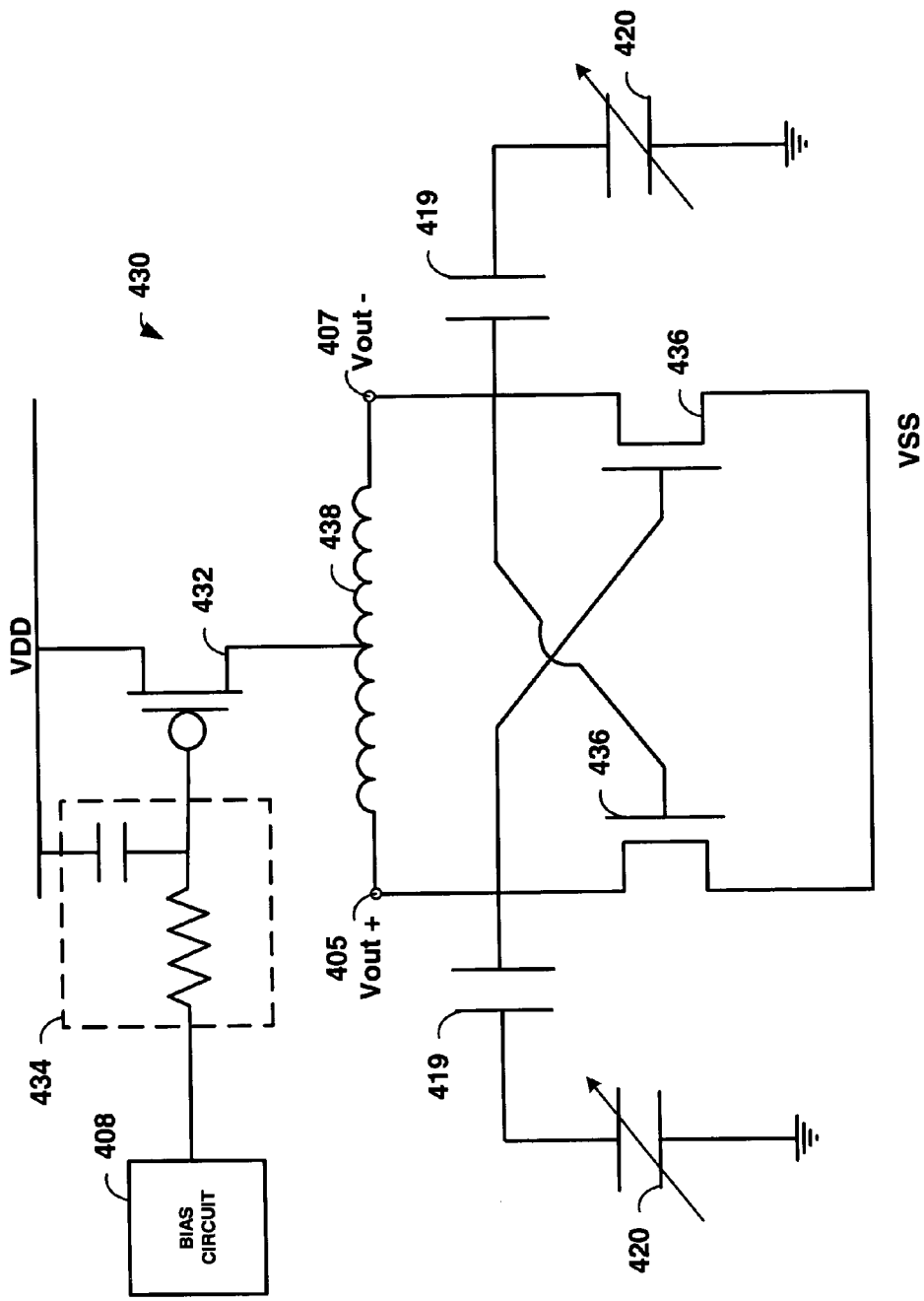

FIG. 8C depicts VCO 430 that is susceptible to noise from a power supply or bias circuit 408, as well as noise from pFET transistor 432. This noise is filtered or reduced by RC filtering circuit 434 coupled to the bias circuit and pFET transistor 432. As discussed previously, VCO 430 comprises a pair of cross-coupled transistors 436 and inductor 438. The output of VCO 430 is taken as the differential across inductor 438 at terminals 405 and 407. As with FIG. 8A, it is important to reduce noise supplied to the circuit since such noise can adversely affect the VCO output signal. Also, ac-coupling capacitors 419 may be employed to isolate DC voltage from 405 and 407 to varactors 420.

Figure 8D:
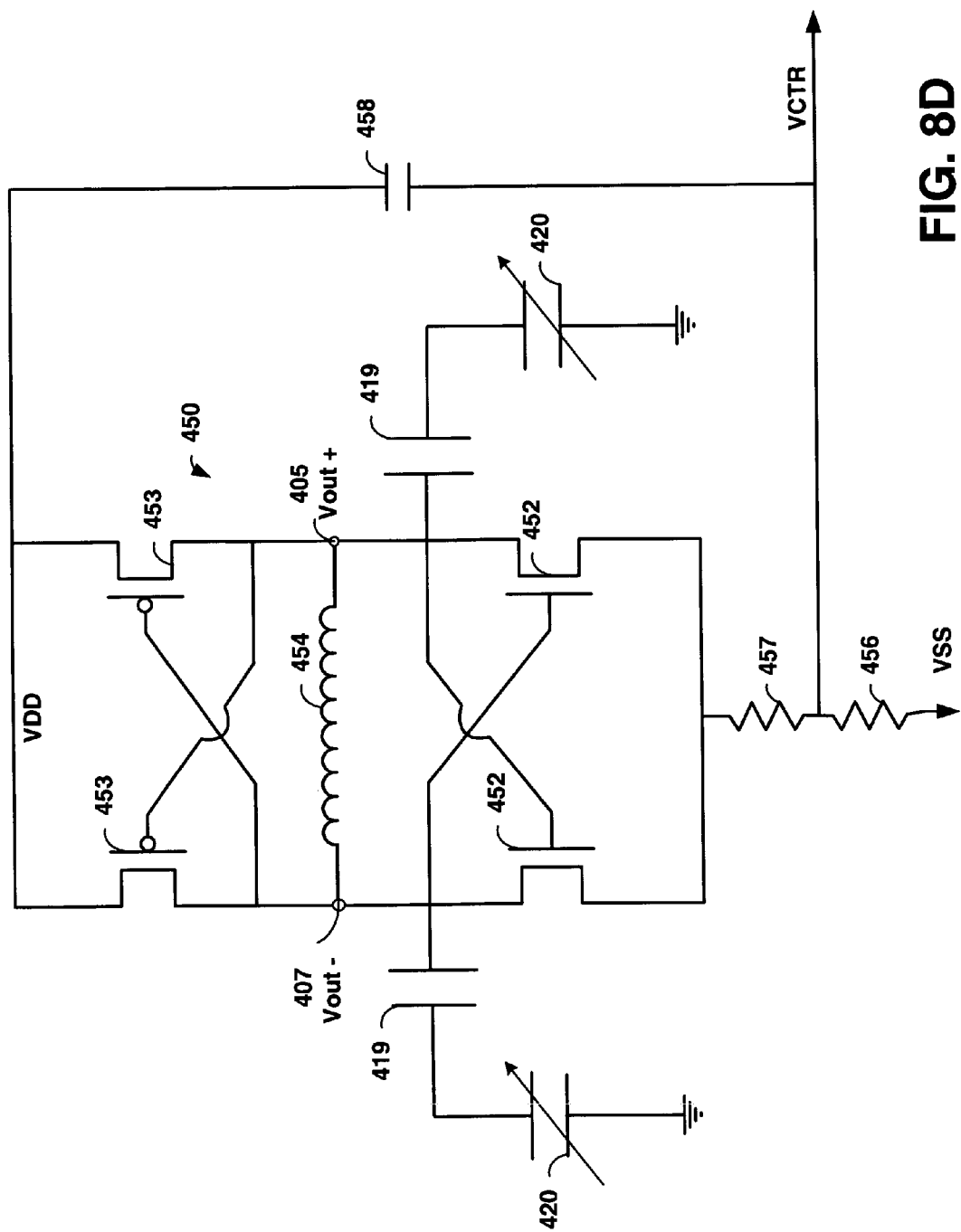

FIG. 8D depicts yet another embodiment of a VCO. Here VCO 450 comprises two pairs of cross-coupled transistors, an NFET pair 452 and a PFET pair 453. The output of VCO 450 is again taken as the differential across inductor 454 at terminals 405 and 407. An RC circuit comprising a resistor 456, a capacitor 458, are again used to filter 1/f noise and white noise from the power supply noise to VCO 450. Additionally, the filtering node, VCTR, may be brought out of the chip to connect to a larger capacitor for better filtering. This clean voltage may be used as a clean control voltage for other purposes. It is also important to note in FIG. 8D that the voltage applied to 450 between the sources of NFET pair 452 and VDD may be dropped or reduced by resistor 457. This resistor also functions to raise the voltage between VCTR and VDD.

The VCOs provided above each include a filtering circuit that reduces noise contained within signals provided to the VCO and hence helps to stabilize the VCO's output. The noise filtered may include 1/f noise, power supply noise, bias voltage noise or other like sources of noise. Although only cross coupled VCOs were depicted in the FIGs, any similar VCO known to those skilled in the art may be used.

Figure 10:
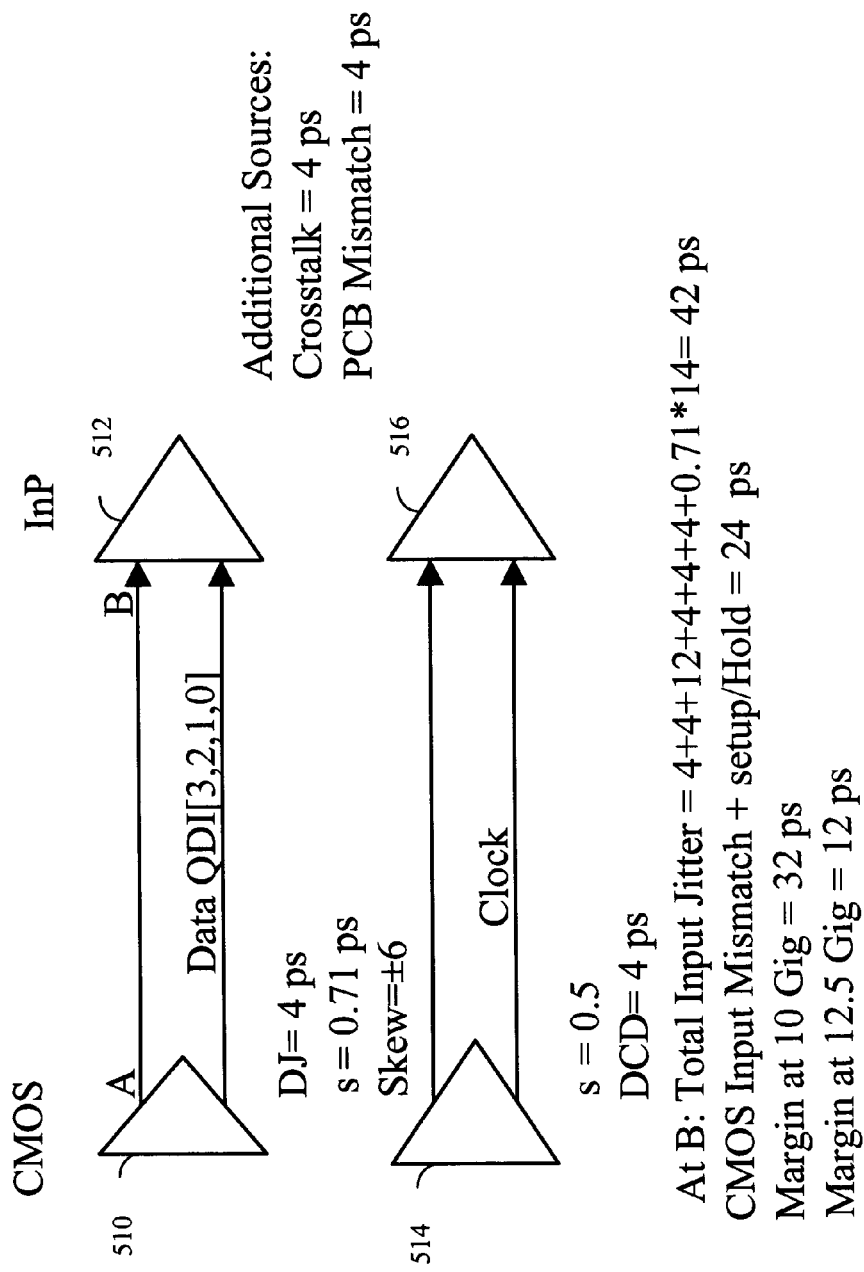
FIG. 10 is a block diagram illustrating the jitter allocation for the RX link between RX data multiplexer circuits of FIG. 3.

FIG. 9 includes a table and a diagram that illustrate operating specifications for the RX interface between the RX data demultiplexer circuits 308 and 306 of FIG. 3. As shown in FIG. 9, the receiver input parameters are shown at 500 and an equivalent circuit thereupon is shown at 502. The clock signals generated by the VCOs discussed above must be stable in order to allow the interface to meet the jitter specification provided in FIG. 9 to ensure that data is properly latched and centered as illustrated in FIGS. 10 and 11 between multiplexers and demultiplexers. Otherwise, the clock signal will not be sufficiently stable. Instability may adversely impact the integrity of data. Therefore, clock signal must be stable enough, such that any jitter for the internal clock still permits the interface specification can be met.

FIG. 10 provides a block diagram illustrating the jitter allocation for the RX link between RX data demultiplexer circuits 308 and 306 of FIG. 3. One of four data differential data line drivers 510 of the RX data demultiplexer circuit 308 and a differential clock driver 512 of the RX data demultiplexer circuit 308 on the 4 bit stream 10 GBPS side are shown. FIG. 10 also shows one of four data input buffers 514 of the RX data demultiplexer circuit 306 and a clock input buffer 516 of the RX data demultiplexer circuit 306. As is indicated, deterministic jitter for the data interface is specified as a maximum of 8 picoseconds. Further, the skew or non-deterministic jitter in the data lines is limited to ±8 picoseconds. The additional information provided in FIG. 10 shows how these jitters may be summed to result in maximum jitters. The clock signals produced in the VCOs described above cannot contribute to a total jitter that exceeds the maximum allowable jitter.

FIG. 11 provides a timing diagram illustrating the set up and hold operations on the 4 bit×10 GBPS links between the TX data demultiplexer integrated circuits 306 and 308 of FIG. 3. In particular, the diagram illustrates the jitter relationships and definitions of the data 520, the DDR clock 522 and a full rate clock 524. As discussed in FIGS. 9 and 10, the VCOs described above cannot contribute to a total jitter that exceeds the maximum allowable jitter. Such a contribution would result in unusable data output from the circuit.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A high speed bit stream data conversion circuit comprising:
   a first data conversion circuit that receives at least one first bit stream at a first bit rate and a corresponding first bit stream data clock and that produces at least one second bit streams at a second bit rate, wherein the number and bit rate of the at least one first bit stream and the at least one second bit stream differ; and
   a clock circuit that produces a Reference Clock Signal based on a plurality of inputs that include the first bit stream data clock, wherein the Reference Clock Signal is used to latch the at least one first bit stream, wherein the clock circuit comprises:
   a phase locked loop (PLL) having a phase detector that receives the first bit stream data clock and a loop output, a charge pump, a loop filter, a Voltage Controlled Oscillator (VCO), and a divider, wherein the VCO comprises a pair of cross-coupled transistors, an inductor coupled to the cross-coupled transistors, and a filtering circuit having a capacitor and a variable resistor.

2. The high-speed bit stream data conversion circuit of claim 1, wherein the filtering circuit reduces noise contained within a bias voltage provided to the VCO.

3. The high speed bit stream data conversion circuit of claim 1, wherein the filtering circuit reduces 1/f noise and white noise.

4. The high speed bit stream data conversion circuit of claim 1, wherein the resistor within the filtering circuit acts to reduce the voltage applied to the VCO core.

5. The high-speed bit stream data conversion circuit of claim 1, wherein the VCO circuit further comprises a second resistor to adjust VCTR voltage.

6. The high speed bit stream data conversion circuit of claim 1, wherein the plurality of inputs further comprise:
   a Loop Timing Clock Signal;
   an External Reference Clock Signal; or
   a Reverse Clock Signal provided by an external data conversion circuit.

7. The high speed bit stream data conversion circuit of claim 1, wherein the first data conversion data conversion circuit multiplexes the at least one first bit stream into the at least one second bit stream.

8. The high speed bit stream data conversion circuit of claim 7, further comprising a second data conversion data conversion circuit that receives the at least one second bit stream at the second bit rate and multiplexes into at least one third bit streams at a third bit rate, wherein the number of the at least one third bit streams is less than the number of the at least one second bit streams, and the bit rate of the at least one third bit stream and exceeds the bit rate of the at least one second bit stream.

9. The high speed bit stream data conversion circuit of claim 8, wherein a selectable forward/reverse clock relationship exists between the first data conversion data conversion circuit and the second data conversion circuit.

10. The high speed bit stream data conversion circuit of claim 1, wherein the clock circuit further comprises a phase detector operable to generate a phase adjustment signal to the first data conversion circuit.

11. The high speed bit stream data conversion circuit of claim 1, wherein the first data conversion circuit demultiplexes the at least one first bit stream into the at least one second bit stream.

12. The high speed bit stream data conversion circuit of claim 11, further comprising a second data conversion circuit that receives the at least one second bit stream at the second bit rate and demultiplexes the at least one second bit stream into a plurality of third bit streams at a third bit rate, wherein the number of the plurality of third bit streams exceed the number of the at least one second bit streams, and the bit rate of the at least one second bit stream and exceeds the bit rate of the plurality of third bit streams.

13. The high speed bit stream data conversion circuit of claim 12, wherein a switchable master/slave relationship exists between the first data conversion circuit and the second data conversion circuit.

14. The high speed bit stream data conversion circuit of claim 13, wherein the clock circuit further comprises a phase detector operable to generate a phase adjustment signal to the first data conversion circuit.

15. A method of producing a Reference Clock Signal, within a clock circuit, wherein the Reference Clock Signal is used to latch data between at least one first bit stream and at least one second bit stream, wherein the number and bit rate of the at least one first bit stream and the at least one second bit stream differ, comprising the steps of:
   generating with a Voltage Controlled Oscillator (VCO) one of a plurality of inputs to a Phase Locked Loop (PLL) within the clock circuit, wherein the plurality of inputs to the PLL include a first bit stream data clock, and wherein the input provided by the VCO comprises a VCO Output Signal;
   reducing noise contained within the VCO Output Signal with a filtering circuit coupled to the VCO, wherein the filtering circuit has a capacitor and a resistor;
   selecting from the plurality of inputs to the PLL, an input from which the Reference Clock Signal will be generated; and
   generating within the clock circuit, the Reference Clock Signal from the selected input.

16. The method of claim 15, further comprising the steps of providing a Loop Timing Clock Signal, an External Reference Clock Signal, and/or a Reverse Clock Signal as the plurality of inputs to the PLL.

17. The method of claim 15, wherein the noise contained within the VCO Output Signal is within a bias voltage provided to the VCO.

18. The method of claim 15, wherein the step of reducing 1/f noise and white noise from a bias current reduces noise contained within the VCO Output Signal.

19. The method of claim 15, further comprising the step of reducing the voltage applied to the VCO core with the resistor of the filtering circuit and a voltage adjusting resistor.

20. The method of claim 18, wherein the Reference Clock Signal is generated within a multistage data conversion circuit used to multiplex at least one first bit streams to at least one second bit stream.

21. The method of claim 18, wherein the Reference Clock Signal is generated within a multistage data conversion circuit used to demultiplex at least one first bit streams to at least one second bit stream.

* * * * *